(12) United States Patent
Sneh

(10) Patent No.: US 6,617,173 B1
(45) Date of Patent: Sep. 9, 2003

(54) INTEGRATION OF FERROMAGNETIC FILMS WITH ULTRATHIN INSULATING FILM USING ATOMIC LAYER DEPOSITION

(75) Inventor: Ofer Sneh, Broomfield, CO (US)

(73) Assignee: Genus, Inc., Sunnyvale, CA (US)

( * ) Notice: Subject to any disclaimer, the term of this patent is extended or adjusted under 35 U.S.C. 154(b) by 0 days.

(21) Appl. No.: 09/974,076

(22) Filed: Oct. 10, 2001

Related U.S. Application Data

(60) Provisional application No. 60/239,614, filed on Oct. 11, 2000.

(51) Int. Cl.[7] .............................................. H01L 21/00

(52) U.S. Cl. ......................................................... 438/3

(58) Field of Search .............................. 438/3, 197–200, 438/585–596, 759, 800; 257/295

(56) References Cited

U.S. PATENT DOCUMENTS

| | | |
|---|---|---|
| 4,058,430 A | 11/1977 | Suntola et al. |
| 4,389,973 A | 6/1983 | Suntola et al. |
| 4,413,022 A | 11/1983 | Suntola et al. |
| 4,416,933 A | 11/1983 | Antson et al. |
| 4,533,410 A | 8/1985 | Ogura et al. |
| 4,533,820 A | 8/1985 | Shimizu |
| 4,689,247 A | 8/1987 | Doty et al. |
| 4,828,224 A | 5/1989 | Crabb et al. |
| 4,836,138 A | 6/1989 | Robinson et al. |
| 4,846,102 A | 7/1989 | Ozias |
| 4,907,862 A | 3/1990 | Suntola |
| 4,913,929 A | 4/1990 | Moslehi et al. |
| 4,975,252 A | 12/1990 | Nishizawa et al. |
| 4,976,996 A | 12/1990 | Monkowski et al. |
| 4,993,360 A | 2/1991 | Nakamura |
| 5,000,113 A | 3/1991 | Wang et al. |
| 5,015,503 A | 5/1991 | Varrin, Jr. et al. |
| 5,077,875 A | 1/1992 | Hoke et al. |
| 5,078,851 A | 1/1992 | Nishihata et al. |
| 5,119,760 A | 6/1992 | McMillan et al. |
| 5,156,820 A | 10/1992 | Wong et al. |
| 5,194,401 A | 3/1993 | Adams et al. |
| 5,204,314 A | 4/1993 | Kirlin et al. |
| 5,270,247 A | 12/1993 | Sakuma et al. |
| 5,281,274 A | 1/1994 | Yoder |
| 5,294,778 A | 3/1994 | Carman et al. |
| 5,320,680 A | 6/1994 | Learn et al. |
| 5,336,327 A | 8/1994 | Lee |
| 5,484,484 A | 1/1996 | Yamaga et al. |
| 5,552,910 A | 9/1996 | Okano |

(List continued on next page.)

FOREIGN PATENT DOCUMENTS

| | | |
|---|---|---|
| EP | 0511264 | 1/1991 |
| EP | 0511264 | 7/1991 |
| EP | 0 442490 A1 | 8/1991 |
| EP | 0 442490 B1 | 8/1991 |
| JP | 60-10625 | 1/1985 |
| JP | 2-152251 | 6/1990 |
| JP | 5-152215 | 6/1993 |
| JP | 8-236459 | 9/1996 |
| JP | 10-102256 | 4/1998 |
| WO | WO 91/10510 A1 | 7/1991 |

OTHER PUBLICATIONS

Slaughter et al. JOM–e, 52(6)(2000). Jun. 2000 electronica article, JOM: The Member Journal of The Minerals, Metals & Materials Society <<http://www.tms.org/pubs/journals/JOMS/0006/Slaughter/Slaughter–0006.html>>.*

Singer Peter "Atomic Layer Deposition Targets Thin Films" Semiconductor International, Sep. 1, 1999.*

Kizilyalli et al. Derwent Abstracted Publication GB 2344694A "High dielectric constant capacitors for DRAM . . ." Jul. 25, 2000.*

(List continued on next page.)

*Primary Examiner*—Craig Thompson
(74) *Attorney, Agent, or Firm*—Blakely Sokoloff Taylor & Zafman LLP

(57) ABSTRACT

A technique to form an ultrathin dielectric layer over a ferromagnetic layer by atomic layer deposition.

21 Claims, 6 Drawing Sheets

U.S. PATENT DOCUMENTS

| | | | |
|---|---|---|---|
| 5,582,866 A | 12/1996 | White | |
| 5,693,139 A | 12/1997 | Nishizawa et al. | |
| 5,711,811 A | 1/1998 | Suntola et al. | |
| 5,749,974 A | 5/1998 | Habuka et al. | |
| 5,788,447 A | 8/1998 | Yonemitsu et al. | |
| 5,851,849 A | 12/1998 | Comizzoli et al. | |
| 5,879,459 A | 3/1999 | Gadgil et al. | |
| 5,916,365 A | 6/1999 | Sherman | |
| 5,935,338 A | 8/1999 | Lei et al. | |
| 5,960,252 A | * 9/1999 | Matsuki et al. | 438/240 |
| 6,007,330 A | 12/1999 | Gauthier | |
| 5,015,590 A | 1/2000 | Suntola et al. | |
| 6,027,975 A | * 2/2000 | Hergenrother et al. | 438/138 |
| 6,042,652 A | 3/2000 | Hyun et al. | |
| 6,050,216 A | 4/2000 | Szapucki et al. | |
| 6,054,398 A | * 4/2000 | Pramanick | 438/758 |
| 6,077,775 A | 6/2000 | Stumborg et al. | |
| 6,090,442 A | 7/2000 | Klaus et al. | |
| 6,124,158 A | 9/2000 | Dautartas et al. | |
| 6,139,700 A | 10/2000 | Kang et al. | |
| 6,143,659 A | 11/2000 | Leem | |
| 6,200,893 B1 | 3/2001 | Sneh et al. | |
| 6,270,572 B1 | 8/2001 | Kim et al. | |
| 6,305,314 B1 | 10/2001 | Sneh et al. | |

OTHER PUBLICATIONS

Freitas et al. (Intermag 2000 Digest of Technical Papers) Inspec abstract Sep. 2000.*

Bedair, S. M. et al., "Atomic Layer Epitaxy of III–V Binary Compounds," Appl. Phys. Lett. (1985) 47(1): 51–3.

Bedair, S. M. "Atomic Layer Epitaxy Deposition Processes," J. Vac. Sci. Technol. (1994) B12(1): 179–85.

Colas, E. et al., "Atomic Layer Epitaxy of Device Quality GaAs," Appl. Phys. Lett. (1989) 55 (26): 2769–71.

Colter, P.C. et al., "Atomic Layer Epitaxy of Device Quality GaAs with a 0.6 pm/h Growth Rate," Appl. Phys. Lett. (1991) 59(12): 1440–42.

Dillon, A.C. et al., "Surface Chemistry of Al2O3 Deposition Using Al(CH3)3 and H2O in a Binary Reaction Sequence," Surf. Sci. (1995) 322(1–3): 230–42.

Farrell, J.T. et al., "High Resolution Infrared Overtone spectroscopy of N2–HF: Vibrational Red Shifts and Predissociation Rate as a Function of HF Stretching Quanta,"J. Phys. Chem. (1994) 98(24): 6068–74.

Fujiwara, H. et al., "Low Temperature Grown of ZnS,, Sel_, Alloys Fabricated by Hydrogen Radical Enhanced Chemical Vapor Deposition in an Atomic Layer Epitaxy Mode," J. Appl. Phys (1993) 74(9): 5510–5.

George, S. M. et al., "Atomic Layer Controlled Deposition of SiO2 and Al2O3 Using ABAB . . . Binary Reaction Sequence Chemistry," Appl. Surface Sci. (1994) 82/83: 460–7.

George, S.M. et al., "Surface Chemistry for Atomic Layer Growth," J. Phys. Chem . . . (1996) 100(31): 13121–31.

Goodman, C. et al., "Atomic layer Epitaxy," J. Appl. Phys. (1986) 60(3): R65–R81.

Gotoh, J. et al, "Low–Temperature Growth of ZnSe–Based Pseudomorphic Structures by Hydrogen–Radical–Enhanced Chemical Vapor Deposition," J. Cryst. Growth (1992) 117: 85–90.

Higashi, G. et al., "Sequential Surface Chemical Reaction Limited Growth of High Quality Al2O3 Dielectrics," Appl. Phys. Lett. (1989) 55(19): 1963–5.

Hukka, T. et al., "Novel Method for Chemical Vapor Deposition and Atomic Layer Expitaxy Using Radical Chemistry," Thin Solid Films (1993) 225: 212–18.

Imai, S. et al., "Atomic Layer Epitaxy of Si Using Atomic H," Thin Solid Films (1993) 225: 168–72.

Imai, S. et al., "Hydrogen Atom Assisted ALE of Silicon," Appl. Surf. Sci. (1994) 82–83: 322–6.

Kattelus, H. et al., "Layered Tantalum–Aluminum Oxide Films Deposited by Atomic Layer Epitaxy," Thin Solid Films (1993) 225: 296–98.

Klaus, J.W. et al., "Atomic Layer Deposition of SiO2 Using Catalyzed and Uncatalyzed Self–Limiting Surface Reactions," Surf. Review and Letters (1999) 6(3–4): 435–48.

Klaus, J.W. et al., "Growth of SiO2 at a Room Temperature with the Use of Catalyzed Sequential Half Reactions," Science (1997) 278(5345): 1934–6.

Kodama, K. et al., "In situ X–ray Photoelectron Spectroscopic Study of GaAs Grown by Atomic Layer Epitaxy," Appl. Phys. Lett. (1989) 54(7): 656–7.

Koleske, D. et al., "Atomic Layer Epitaxy of Si on Ge(100) Using Si2C16 and Atomic Hydrogen," Appl. Phys. Lett. (1994) 64(7): 884–6.

Koleske, D. et al., "Surface Morphology of Si on Si(100) Grown Below 500 Degrees C Using H/CI Exchange Chemistry," J. Appl. Phys. (1993) 74(6): 4245–7.

Lubben, D. et al., "UV Photostimulated Si Atomic–Layer Epitaxy," Mat. Res. Soc. Symp. Proc. (1991) 222: 177–187.

McDermott, B. et al., "Ordered GalnP by Atomic Layer Epitaxy," J. Cryst. Growth (1991) 107 (1–4): 96–101.

Nishizawa, J. et al., "Molecular Layer Epitaxy of Silicon," J. Cryst. Growth (1990) 99: 502–5.

O'Hanlon, J. "Gas Release From Solids," A User's Guide to Vacuum Technology (1989) Chap. 4: 56–71.

Ott, A.W. et al., "Al2O3 Thin Film Growth on Si(100) Using Binary Reaction Sequence Chemistry," Thin Solid Films (1997) 292(1–2): 135–44.

Ott, A. W. et al., "Modification of Porous Alumina Membranes Using Al2O3 Atomic Layer Controlled Deposition," Chem. of Materials (1997) 9(3): 707–14.

Ott, A.W. et al., "Surface Chemistry of In2O3 Deposition Using In(CH3)3 and H2O in a Binary Reaction Sequence," Appl. Surf. Sci. (1997) 112: 205–15.

Ozeki, M. et al., "Kinetic Processes in Atomic–Layer Epitaxy of GaAs and AlAs Using a Pulsed Vapor–Phase Method," J. Vac. Sci. Technol. (1987) B5(4): 1184–86.

Ritala, M. et al. "Growth of Titanium Dioxide Thin Films by Atomic Layer Epitaxy," Thin Solid Films (1993) 225: 288–95.

Ritala, M. et al., "Surface Roughness Reduction in Atomic Layer Epitaxy Growth of Titanium Dioxide Thin Films," Thin Solid Films (1994) 249: 155–62.

Roth, A. "The Vacuum," Vacuum Technology (1990) Chap. 1: 1–7 and Chap. 2: 28–45.

Sakaue, H. et al., "Digital Chemical Vapor Deposition of SiO2 Using a Repetitive Reaction of Triethysilane/Hydrogen and Oxidation," Jpn. J. of Appl. Phys. (1990) 30(113): L124–7.

Sneh, O. and George S. "Diffusion of Xe on a Stepped It (11, 11,9)) Surface," Am. Chem. Soc. Abstracts of Papers (1993) Part 2 (235).

Sneh, O. and George, S. "Xenon Diffusion on a Stepped It (11, 11,9)) Surface," J. Chem. Phys.(1994) 101(4): 3287–97.

Sneh, O. et al., "Adsorption and Desorption Kinetics of H2O on a Fully Hydroxylated SiO2 Surface," Surface Science (1996) 364: 61–78.

Sneh, O. et al., "Atomic Layer Growth of SiO2 on Si(100) Using SiCl4 and H2O in a Binary Reaction Sequence," Surf Sci.. (1995) 334: 135–52.

Sneh, O. et al., "Atomic Layer Growth of SiO2 on Si(100) Using the Sequential Depostion of SiCl4 and H2O," Mat. Res. Soc. Symp. Proc., (1994) 334:25–30.

Sneh, O. et al., "Atomic Layering Shows Its Metal," European Semiconductor (2000) 22(7): 33–6.

Sneh, O. et al., "Sample Manipulator Employing a Gas–Thermal Switch Designed for High Pressure Experiments in an Ultrahigh Vacuum Apparatus," J. Vac. Sci. Technol. (1995) A13(2): 493–6 '.

Sneh, O. et al., "Thermal Stability of Hydroxyl Groups on a Well–Defined Silica Surface," J. Phys. Chem.. (1995) 99(13): 4639–47.

Somorjai, G. "An Introduction to Surface Chemistry and Catalyst," Surface (1994) Chap. 1: 12–7.

Sugahara, S. et al., "Atomic Layer Epitaxy of Germanium," Appl. Surf. Sci. (1994) 82–83: 380–6.

Suntola, T. "Atomic Layer Epitaxy," Handbook of Crystal Growth 3 (1994) Chap. 14: 605–63.

Suntola, T. "Atomic Layer Epitaxy," Materials Science Reports (1989) 4:261–312.

Suntola, T. "Atomic Layer Epitaxy," Thin Solid Films (1992) 216: 84–9.

Suntola, T. "Cost Effective Processing by Atomic Layer Epitaxy," Thin Solid Films (1993) 225: 96–8.

Suntola, T. "Surface Chemistry of Materials Deposition at Atomic Layer Level," Appl. Surf Sci. (1996)'100/101: 391–8.

Suntola, T. et al., "Atomic Layer Epitaxy," Blackie & Son Ltd. (1990): 1–39.

Tischler, M.A. et al., "Growth and Characterization of Compound Semiconductors by Atomic layer Epitaxy," J. Cryst. Growth (1986) 77: 89–94.

Watanabe, A. et al., "The Mechanism of Self–Limiting Growth of Atomic Layer Epitaxy of GaAs by Metalorganic Molecular Bean Epitaxy Using Trimethylgallium and Arsine," Jpn. J. of Appl. Phys. (1989) 28(7): L 1080–82.

Wise, M.L. et al., "Adsorption and Decomposition of Diethyldiethoxysilane on Silicon Surfaces: New Possibilites for SiO2 Deposition," J. Vac Sci. Technol. (1995) B 13(3): 865–75.

Wise, M.L. et al., "H2O Adsorption Kinetics on Si(111) 7×7 and Si(111) 70 Modified by Laser Annealing," J. Vac. Sci. Technol. (1995) Al 3(4): 1853–60.

Wise, M.L. et al., "Diethyldiethoxysilane as a New Precursor for SiO2 Growth on Silicon," Mat. Res. Soc. Symp. Proc., (1994) 334: 37–43.

Wise, M.L. et al., "Reaction Kinetics of H2O with Chlorinated Si(I 11)–7×7 and Porous Silicon Surfaces," Surf. Sci.(1996) 364(3):367–79.

Yamaga, S. and Yoshikawa, A. "Atomic Layer Epitaxy of ZnS by a New Gas Supplying System in Low–Pressure Metalorganic Vapor Phase Epitaxy," J. Cryst. Growth (1992) 117: 152–155.

Yarnoff, J. et al., "Atomic Layer Epitaxy of Silicon by Dichlorosilane Studied with Core Level Spectroscopy," J. Vac. Sci. Technol. (1992) A10(4): 2303–7.

Yokoyama, H. et al., "Atomic Layer Epitaxy of GaAs Using Nitrogen Carrier Gas," Appl. Phys. Lett. (1991) 59(17): 2148–49.

U.S. Patent Application, Ser. No. 09/480,804, entitled "Fully Integrated Process For MIM Capacitors Using Atomic Layer Deposition".

Moodera, J. et al., "Spin Polarized Tunneling in Ferromagnetic Junctions", Journal of Magnetism and Magnetic Materials 200 (1999) 248–273.

Moodera, J. et al., "Interface Magnetism and Spin Wave Scattering In Ferromagnet–Insulator–Ferromagnet Tunnel Junctions", Physical Review Letters 80 (13) Mar. 30, 1998, pp. 2941–2944.

\* cited by examiner

INTEGRATION OF FERROMAGNETIC FILMS WITH ULTRATHIN INSULATING FILM USING ATOMIC LAYER DEPOSITION

RELATED APPLICATION

This application claims priority from U.S. Provisional Pat. App. Ser. No. 60/239,614 entitled "Integration of Ferromagnetic Films With Ultrathin Insulating Films for Fabrication of Tunneling Devices Using Atomic Layer Deposition" filed Oct. 11, 2000.

FIELD OF THE INVENTION

The present invention relates generally to thin film deposition technology pertaining to magnetic storage devices and, more particularly, to a process of manufacturing ferromagnetic-insulator-ferromagnetic tunneling devices in which atomic layer deposition is used to prepare and form the insulator film.

BACKGROUND OF THE RELATED ART

In the manufacture of magnetic storage devices, deposition techniques for thin films of various pure and compound materials have been developed to achieve the deposition of such thin films. Recently emerging spin polarized tunneling devices in ferromagnetic-insulator-ferromagnetic (FM/I/FM) tunneling junctions indicates that this technology has applications for non-volatile magnetic memory elements or storage media.

In the manufacture of FM/I/FM materials, ferromagnetic metallic electrodes for these devices may be deposited using available Physical Vapor Deposition (PVD) processes. Although tunneling devices can be manufactured using the Physical Vapor Deposition process, a number of acute disadvantages are noted with this technique. For example, an ultra thin continuous and high quality insulating (dielectric) film, having a thickness in the range of 5–20 Å, is difficult to achieve with PVD, since discontinuities result with PVD nucleation processes. Furthermore, oxidation of ferromagnetic materials at the FM/I interface may occur during reactive sputtering process from energetic and atomic oxygen and such oxidation is undesirable, since such oxidation at the FM/I interface may be detrimental to device performance. Given the difficulties to deposit continuous oxide films with PVD and given the unavoidable effects of substrate oxidation an alternative PVD solution has implemented sputtering evaporation or molecular beam deposition of ultrathin metal films, such as Aluminum, followed successfully by an in situ oxidation. However, this method may not, so far, produce adequate results. Accordingly, standard PVD techniques may have difficulty meeting the deposition of insulating material (I) on ferromagnetic material (FM).

In the field of chemical vapor deposition (CVD), a process known as atomic layer deposition (ALD) has emerged as a different but promising technique to extend the abilities of CVD. Generally, ALD is a process wherein conventional CVD processes are divided into single-monolayer depositions, in which each separate deposition step theoretically goes to saturation at a single molecular or atomic monolayer thickness and self-terminates when the mono layer formation occurs on the surface of a material. Generally, in the standard CVD process the precursors are fed simultaneously into a reactor. In an ALD process the precursors are introduced into the reactor separately at different steps. Typically the precursors are introduced separately by alternating the flow of the precursor to combine with a carrier gas being introduced into the reactor while coexistence of the precursors in the reactor is maintained by appropriately purging the reactor in between successive introduction of precursors.

For example, when ALD is used to deposit a thin film layer on a material layer, such as a semiconductor substrate, saturating at a single molecular or atomic monolayer of thickness results in a formation of a pure desired film and eliminates the extra atoms that comprise the molecular precursors (or ligands). By the use of alternating precursors, ALD allows for single layer growth per cycle so that much tighter thickness controls can be exercised to deposit an ultra thin film. Additionally, ALD films may be grown with continuity with thickness that is as thin as a monolayer (3–5 Angstroms). This capability is one unmatched characteristic of ALD films that makes them superior candidates for applications that require ultrathin films such as insulator in FM/I/FM devices.

The present invention is directed to providing an ultra thin insulation (dielectric) layer above a ferromagnetic layer by the utilization of atomic layer deposition. Such technique may then be employed to fabricate FM/I/FM tunneling junctions, which may then fabricate magnetic storage devices. Sharp interfaces at the FM/I junctions are considered to be important characteristic for ultimate performance of FM/I/FM tunneling junction devices. Accordingly, integration of ferromagnetic bottom electrode with the insulator is an important aspect of obtaining a good FM/I junction to construct FM/I/FM devices. Current PVD technology implements a sequence of PVD depositions at high and ultra high vacuum as the leading approach for making the interface between the bottom ferromagnetic electrode and the overlying insulator material. PVD alone makes the fabrication of the insulator layer above the ferromagnetic bottom electrode elusive, but especially for an insulator which is oxide and contamination free.

Furthermore, an integration of PVD and CVD based technology is difficult to achieve considering that the difference between the vacuum range of metal PVD (which is at High Vacuum to Ultra High Vacuum) and CVD makes the PVD-CVD integration difficult or impractical. This is especially true in particular with PVD of metals and CVD of insulators. That is, depositing a bottom electrode using PVD and depositing a subsequent overlying layer of a dielectric material using CVD is difficult. Specifically, integration of high vacuum/ultra high vacuum PVD process for the deposition of the ferromagnetic layer and subsequent CVD deposition of a dielectric layer to obtain an ultrathin insulator is a challenge.

In addition, in many instances the bottom electrode of the FM/I/FM needed to be patterned. Patterning the electrode requires a process flow with multiple steps involving photolithography and etch. These steps are bound to contaminate and oxidize the top of FM electrode and subsequently deteriorate the performance of the final device. Therefore, a process flow that may provide means to protect the electrode during pattern delineation is highly desired.

SUMMARY OF THE INVENTION

A method and apparatus to deposit a first ferromagnetic metal layer onto an underlying material and to deposit a protective sacrificial layer above the first ferromagnetic layer without exposing the first ferromagnetic layer to ambient environment. Then the ferromagnetic electrode film may be patterned, if necessary. Then, the material is placed into an atomic layer deposition chamber. The protective sacrificial layer is removed in situ to expose the ferromagnetic layer and without exposing the exposed ferromagnetic layer to the ambient environment, a dielectric layer is deposited over the first ferromagnetic layer by atomic layer deposition.

DETAILED DESCRIPTION OF THE INVENTION

Figure 1:
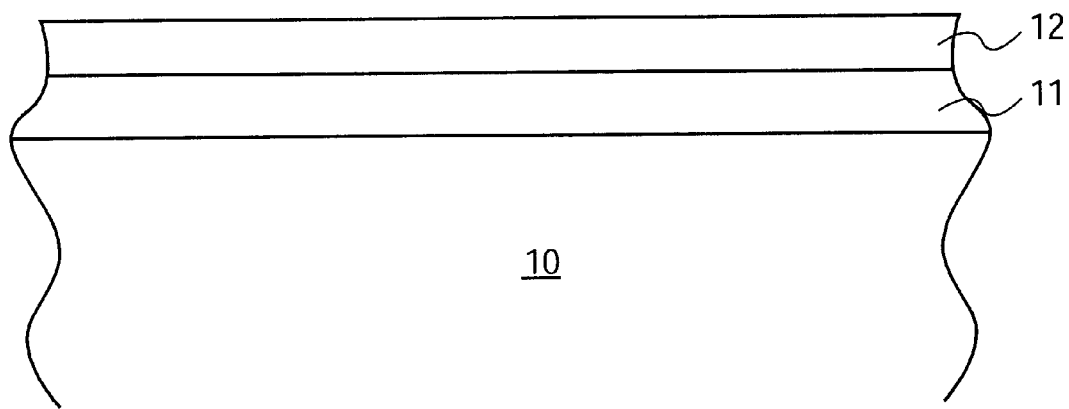
FIG. 1 is a cross-sectional diagram showing a formation of a first ferromagnetic material layer above a substrate in which an overlying protective sacrificial layer is also deposited to cover the first ferromagnetic layer.

The practice of atomic layer deposition (ALD) to deposit a film layer onto a substrate, such as a semiconductor wafer, or onto another material layer typically entails separately introducing molecular precursors into a processing reactor chamber. The ALD technique will deposit an ultrathin film layer atop the underlying material, whether the underlying material is a substrate or another material layer. As noted above, the growth of the ALD layer follows the chemistries associated with chemical vapor deposition (CVD), but the precursors are introduced separately.

In an example ALD process for practicing the invention, the molecular precursors are introduced into the ALD reactor separately. ALD is achieved by flowing one precursor at a time such as a metal precursor MLx that contains a metal element M, which is bonded to x number of atomic or molecular ligands L to make a volatile molecule. The metal precursor reaction is typically followed by inert gas purging to eliminate this precursor from the chamber prior to the subsequent introduction of the next precursor. An ALD reaction will take place if the surface is prepared to react directly with the molecular precursor. For example, the MLx molecule reacts with a ligand attached to the surface. The surface is typically prepared to include a hydrogen-containing ligand, such as AH, where A is a non-metal element bonded to hydrogen and AH is reactive with the metal precursor. The molecular reaction on the surface proceeds to react with the ligands on the surface and deposit a monolayer of the metal with its passivating ligand, so that the desired reaction is noted as $AH+MLx \rightarrow AMLy+HL$, where HL is the exchange reaction by-product. During the reaction the initial surface ligands AH are consumed and the surface becomes saturated with L ligands, that do not further react with the metal precursor MLx Therefore, the reaction self-saturates when all the initial ligands are replaced with MLy species (the subscripts x and y are utilized herein to denote integers, 1, 2, 3, etc.).

After the precursor $ML_x$ reacts with the surface and self-saturates to terminate the reaction, the remaining non-reacted precursor is removed, typically by allowing the carrier gas to purge the processing chamber. The second type of precursor is then introduced to restore the surface activity towards the metal precursor by eliminating the L ligands and redepositing AH ligands. In this example, the second precursor is comprised of $AH_z$, A being a nonmetal element (for example oxygen, nitrogen, or sulfur) and H being hydrogen. For example $H_2O$, $NH_3$ or $H_2S$. The reaction $ML+AH_z \rightarrow MAH_{z-1}+HL$ results in a desired additional element A being deposited as AH terminated sights and the ligand L is eliminated as a volatile byproduct HL. This process converts the surface back to the AH terminated sites, which restores the surface to the initial terminations. Again, the reaction consumes the reactive sites (this time the L terminated sites) and self-saturates when the reactive sites are entirely depleted.

The sequence of surface reactions that restores the surface to the initial point is called the ALD deposition cycle. This deposition cycle allows the films to be layered down in equal metered sequences that are substantially identical in chemical kinetics, deposition per cycle, composition and thickness. Self-saturating surface reactions make ALD insensitive to transport non-uniformity either from flow engineering or surface topography (for example, deposition into high aspect ratio structures).

The present invention uses the ALD process to fabricate a sharp interface at the FM/I junction. An improved interface of the FM/I junction may then be utilized in fabricating a FM/I/FM tunneling junction device, for example, one of the above-mentioned ferromagnetic memory devices. Accordingly, an embodiment of the present invention is described below in reference to the shown Figures. In the description, it is also to be noted that the illustrated embodiment forms the junction and also takes into account the prevention of the oxidation of the underlying ferromagnetic metal layer. That is, after the deposition of the bottom ferromagnetic layer, a protective sacrificial layer is formed to prevent oxidation or contamination of the underlying ferromagnetic layer. The extent of such oxidation varies with the material, as well as the cleaning process used, but typically may account for more than 10 angstroms. Accordingly, one technique for practicing the invention attempts to reduce the thickness of this oxidation at the FM/I interface.

In FIG. 1, one embodiment for practicing the present invention is shown. In this particular embodiment, the base material is a substrate 10 upon which other layers are fabricated. Furthermore, the example substrate in this instance is a ceramic wafer utilized for manufacturing of magnetic storage devices. The example method then deposits a first (or bottom) ferromagnetic material above the substrate 10. Generally, the ferromagnetic material is a thin ferromagnetic film layer 11 deposited above the substrate 10. The ferromagnetic layer 11 is also referred to as the bottom electrode layer, since the FM layer 11 forms the bottom electrode of a FM/I/FM device. In the described embodiment, a conventional physical vapor deposition (PVD) process deposits FM layer 11. Generally the deposition is achieved in a PVD chamber having high vacuum (HV of approximately $10^{-5}$–$10^{-8}$ Torr) or ultra high vacuum (UHV approximately $10^{-8}$–$<10^{-10}$ Torr). The HV or UHV environment of the PVD chamber minimizes substrate exposure to oxidizing or contaminating environment, such as ambient environment. The PVD process may deposit a variety of materials to form the FM layer 11. Without limitation, examples of ferromagnetic materials for use in forming FM layer 11 in a PVD chamber are nickel (Ni), iron (Fe) or cobalt (Co), or alloys such as $Ni_{80}Fe_{20}$, $Co_{50}Fe_{50}$ and $Co_{84}Fe_{16}$. The thickness of the FM layer 11 will vary depending on the particular device design desired. However, an example structure for a FM/I/FM device may fabricate the bottom electrode to have a thickness in the range of approximately 80 Angstroms and is approximately a 200 $\mu$m wide strip.

Subsequently, a protective sacrificial (PS) layer 12 is formed above the bottom FM layer 11. The formation of the PS layer 12 is achieved without exposing the FM layer 11 to oxidizing or contaminating environment, such as the ambient environment. Generally, ambient exposure is prevented, or at least limited, by depositing the PS layer 12 by continuously maintaining the substrate 10 in the HV/UHV environment utilized to deposit the FM layer 11. The environment integrity may be maintained by depositing the PS layer 12 in the same reactor chamber as used for depositing the FM layer 11 or, alternatively, moving the substrate to another reactor chamber of a cluster tool which maintains the same environment for the various chambers in the cluster. Multiple stage PVD tools which are common in the magnetic storage industry are well suitable to deposit the layers 11 and 12 using 2 different sputtering targets. In the embodiment shown, PS layer 12 is deposited also by a PVD process in the same PVD system.

Alternatively, another common design of these tools is to apply the films on multiple substrates that are mounted horizontally on a platen or vertically on a drum and are rotating continuously against a sputtering source to unify the thickness on all substrates. These types of tools typically have several cathodes (sputtering heads) which allow deposition of different materials without ambient exposure when necessary. Typically about 4–10 heads may be mounted on a horizontal tool and 4–6 heads on a vertical tool. These tools are utilized for depositing the FM layer 11 and may then also deposit PS layer 12 as well.

Generally, the protective layer 12 is comprised of a metallic material, although other material chemistry may be utilized. The composition of the PS layer 12 is such that a given etch chemistry will remove the PS layer 12, but not the underlying FM layer 11. That is, the PS layer 12 is selective over the underlying FM layer 11 when etched. The thickness of the PS layer deposited by PVD will depend on other properties, but typically a thin layer in the approximate range of 50–100 Å ensures continuous and pin-hole free film. A variety of materials may be selected for PS layer 12. In one technique where the FM layer is comprised of the afore-mentioned FM materials (Ni, Fe, Co or their alloys), materials such as tungsten (W), WNx, silicon (Si) and SiNx may be readily used for the composition of the PS layer 12. Again, these materials are noted as examples and no intent is made to limit the PS layer 12 to these materials only. It is appreciated that other metals or metal nitrides may be readily used for the PS layer 12 as well provided that they can selectively etched away, in situ, without affecting the underlying FM layer.

In one example technique, a sequential integrated PVD process deposits a W-based PS layer 12 above the FM layer 11 in a continuous process in the same reactor, simply by firing up a tungsten sputtering source when the FM source is turned off. It is appreciated that other techniques and other materials can be readily used to deposit protective layer 12. What is important is that the underlying FM layer 11 is not exposed to the ambient (or other oxidizing or contaminating) environment. Thus, the protective layer 12 protects layer 11 from oxidation and contamination.

Once the PS layer 12 forms a protective covering over the underlying FM layer 11, the substrate can than be removed from the vacuum environment. Since the FM layer 11 is protected by the PS layer 12, the substrate having the FM/PS structure may now be exposed to the ambient environment as well as to materials and chemistries that comprise a pattern delineation process.

Figure 2:
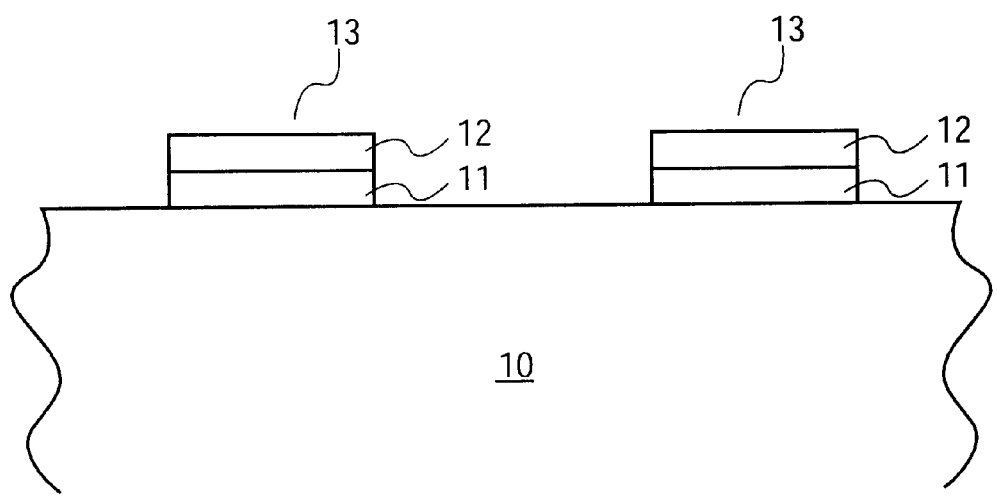
FIG. 2 is a cross-sectional diagram showing the patterning and etching of the structure of FIG. 1 to form a FM patterned electrode.

Referring to FIG. 2, the structure of FIG. 1 may then subsequently be subjected to a photolithography and etch to form a patterned FM/PS structure 13. As illustrated in FIG. 2, the PS layer 12 is still present over the FM layer 11 to ensure that the upper surface of the FM layer 11 is still not subjected to the ambient environment. Accordingly, the etch process includes etching PS layer 12 prior to or together with etching FM layer 11.

After completion of the pattern delineated stack 13, the substrate 10 is then placed in an atomic layer deposition (ALD) system which is also under vacuum. It is appreciated that the ALD platform environment may be the same tool as that used for the PVD deposition or, alternatively, the ALD platform may be in a different tool than the tool used for the PVD process. Once under vacuum in the ALD platform, the protective layer 12 is removed by selective etch chemistry. As was noted above, selective etching technique is utilized to remove the PS layer 12 without etching the underlying FM layer 11.

For example, if the FM layer 11 is comprised of materials resistant to fluorine etch chemistry and the PS layer 12 is comprised of W or W-based material, then isotropic fluorine etch chemistry (for example, a remote plasma fluorine chemistry, such as $NF_3$) will selectively etch away the PS layer 12. That is, in a conventional etching technique, $NF_3$ will remove and completely etch materials that have volatile fluoride compounds, such as $WF_6$. This dry chemistry etch does not remove the underlying FM layer 11, since the fluorides of iron (Fe), nickel (Ni) and cobalt (Co) are non-volatile at typical process temperatures approximately below 500° C. Thus, with this selective etching technique the tungsten-based PS layer 12 is removed, while the underlying FM layer 11 remains with its upper surface exposed. Further, the surface of the ferromagnetic material of the FM layer 11 becomes terminated with atomic fluorine by the end of the PS layer 12 removal.

In one embodiment in practicing the invention, the fluorine chemistry continues to be applied to remove the PS layer 12, since continued application of the selective etching chemistry has no adverse effects to the exposed FM layer 11 without detriment. The ability to apply over-etching makes sacrificial layer removal relatively simple and does not require endpoint or tight etch control to prevent over-etching of the underlying FM layer 11. The plasma fluorine chemistry is followed by, for example, $NH_3/H_2$ plasma to remove residual fluorine and residual oxygen from the surface of the FM layer 11. This process also activates the surface of the exposed surface of the FM layer 11 for subsequent ALD application to form a continuous interface above the FM layer 11.

In this particular technique when $NH_3$—$H_2$ plasma is utilized, the surface of the ferromagnetic material of the FM layer 11 is tied with $NH_x$ species that serve as the reactive site to initiate dielectric ALD and also suppress oxidation by residual $H_2O$ from the high vacuum background pressure.

Subsequently the $NH_x$ terminated surface will be reacted with a metal precursor to initiate ALD of the desired insulating material.

Figure 3:
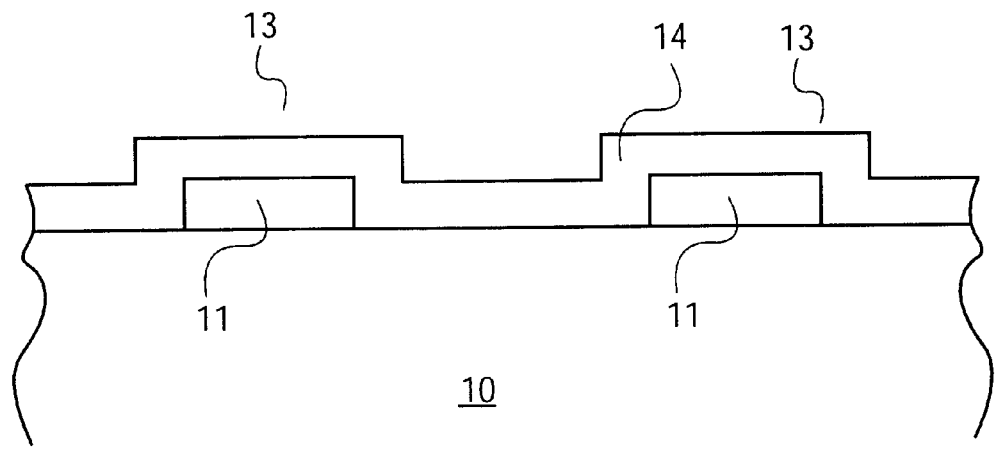
FIG. 3 is a cross-sectional diagram showing a removal of the protective layer of FIG. 2 and a subsequent deposition of a dielectric layer by atomic layer deposition.

Then as shown in FIG. 3, an insulating or dielectric material layer 14 is deposited by ALD. The ALD deposits a uniform and conformal layer 14 over the substrate 10, including stack 13. Generally, it is desirable to have an insulating material with a large band gap. In particular, $Al_2O_3$ has shown desirable properties to serve as a tunneling barrier in FM/I/FM devices. However, in some instances, $Al_2O_3$ deposition requires the usage of oxygen source precursors such as $H_2O$. These chemicals may consequently attack the FM surface causing some oxidation and possible degradation. Thus, although so far $Al_2O_3$ has been the most promising insulator candidate to practice FM/FM, insulating nitride materials may ultimately be implemented for better reliability.

However in contrast, nitride based insulators, such as AlN and $Si_3N_4$ may be better suited for FM/I/FM insulators since these materials are not expected to cause ferromagnetic material degradation. Thus, in other embodiments nitride-based dielectric materials are utilized for dielectric layer 14. In particular, AlN has a band gap of approximately 6 eV, which may facilitate better tunneling control since similar tunneling currents will be achieved with thicker films allowing better control of junction properties. On the other hand, $Al_2O_3$ may be integrated and may be facilitated by ALD chemistries that involve very mild oxidants such as tetra-ethoxysilane (TEOS), which is a very common CVD precursor for $SiO_2$ deposition.

It is to be noted that in the technique described, the dielectric layer 14 is deposited without subjecting the underlying FM layer 11 to ambient environment. Although the thickness of the dielectric layer 14 can be made thick as desired, thickness in the approximate range of 5 to 20 Å are considered to be best and can be achieved with adequate control and continuity by ALD. It is to be appreciated that other chemistries may be utilized to deposit dielectric layer 14 by ALD. The deposition of the dielectric layer 14 by ALD allows for a continuous interface between the FM layer 11 and the overlying dielectric material 14. The continuous interface is achieved since ALD precursors directly bond to the substrate, since films grow layer by layer and since no oxidation or contamination occurs on the surface of the underlying FM layer 11. The deposition of the dielectric material by ALD also permits an ultrathin layer of dielectric material to be formed on the FM layer 11. The ultrathin layer of the dielectric material occurs since ALD deposits one atomic or molecular layer each cycle so that tight tolerances on film thickness may be controlled by the use of ALD to deposit dielectric layer 14.

Figure 4:
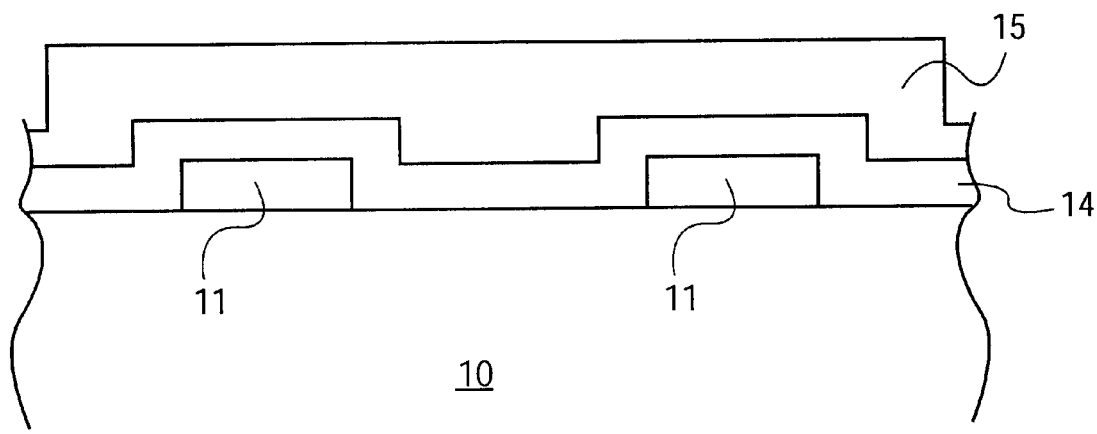
FIG. 4 is a cross-sectional diagram showing a deposition of the second ferromagnetic material layer above the dielectric layer of FIG. 3 to form a FM/I/FM structure.

Following the deposition of the ultrathin continuous insulator material in the form of the dielectric layer 14 by the utilization of ALD, the substrate 10 is unloaded from the ALD platform and loaded again into the PVD platform. As shown in FIG. 4, a deposition of a second FM layer 15 forms the upper or top electrode for the FM/I/FM device. The FM material composition for the FM layer 15 may be the same as for the FM layer 11, although that is not necessarily required. PVD deposition of the second FM layer 15 will be performed with little delay after atomic layer deposition of the dielectric layer 14. The combination of the three layers 11, 14, and 15 forms the FM/I/FM device atop substrate 10. Thus a completed FM/I/FM stack is shown in FIG. 4.

Figure 5:
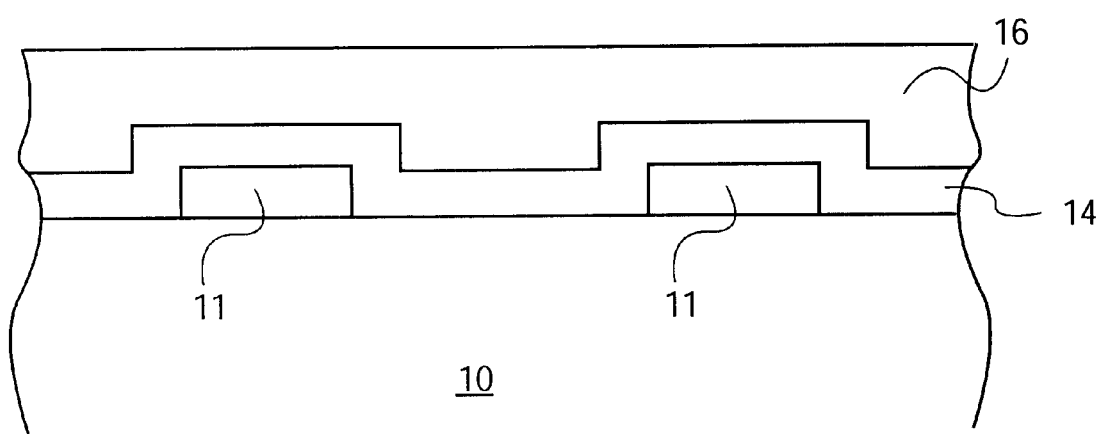
FIG. 5 is a cross-sectional diagram showing an alternative technique of forming another protective sacrificial layer above the dielectric layer of FIG. 3.

Alternatively, as shown in FIG. 5, a second protected sacrificial layer 16 may be deposited by an integrated ALD of W or WNx deposition following the atomic layer deposition of dielectric layer 14. That is, after forming the dielectric layer 14, the precursor chemistry is changed in the ALD reactor to deposit the second PS layer 16 to protect the underlying dielectric layer 13 from ambient exposure. Two examples are W or WNx for the material of the PS layer 16, however, other materials can be readily used. This PS layer 16 is used to protect the upper surface of the dielectric layer 14 during farther patterning of the dielectric layer, if such patterning is required.

When the PS layer 16 is utilized, the PVD system will require the necessary chemistry to selectively remove the protective layer 16. Thus, in the W or WNx example, the PVD system will be equipped with fluorine etch capability to remove the PS layer 16. Since fluorine chemistries are widespread and generally easy to implement, materials selected for the PS layer 16 can be chosen so that the material will selectively etch in this flowing chemistry. In addition, both $Al_2O_3$ and AlN are resistant to fluorine chemistry which makes the selection of material for layer 16 in favor of materials that can be etched with fluorine chemistries. The choice of the PS layer 16 material may also depend on other properties of potential materials. For example, W may be desirable to protect bottom electrode in the case that bottom electrode patterning is desired. In addition to being fairly easy to etch with fluorine chemistries, W may be a good hard mask material with large selectivity for ion milling which is a technique used to etch the Ni—Fe—Co ferromagnetic electrodes following photolithography Tungsten may be conveniently delineated with $H_2O_2$ wet etch or with conventional dry fluorine chemistry to expose the underlying FM material. Subsequently the delineated W can be used to improve critical dimension definition by serving as an ion milling hard mask.

It is appreciated that the atomic layer deposition of $Al_2O_3$ can be deployed by conventional $Al(CH_3)_3$ (trimethylaluminum) $H_2O$ or $AlCl_3/H_2O$ sequences as well as by using the above mentioned aluminum precursors with milder oxidizers such as TEOS. AlN can be deposited by $Al(CH_3)_3/NH_3$ or $AlCl_3/NH_3$ sequences. Finally, ALD can be applied to prepare $AlN/Al_2O_3$ stacks or aluminum oxynitride insulators. It is appreciate that various other materials and configurations can be achieved to form various material sequences. Then, as earlier shown in FIG. 4, the second FM material layer 15 is deposited to form the FM/I/FM structure.

It is appreciated that in one technique to practice the invention, it is desirable to separate ALD chambers of oxides and nitrides. Nitride chambers in particular are kept at low levels of residual $H_2O$ and other oxidants. If AlN or $Si_3N_4$ are suitable as tunneling insulators, the whole integration and deposition process may be carried out in the same chamber. However, if insulators of oxide or oxynitrides are desired, sacrificial layer removal and surface activation may be better achieved in a separate chamber. This chamber may be used for subsequent situ protection of the insulator by a sacrificial W or WN ALD film, if needed.

Furthermore, it is also appreciated that in some instances ALD can be initiated much more readily if a particular surface is pretreated prior to the ALD cycle. For example, in the ALD formation of the dielectric layer 14, pre-treating of the surface of the underlying FM layer 11 may make these surface terminations sights more reactive to the first precursor of the ALD cycle. Such surface pre-treatment to create additional termination sites may be achieved by the introduction of pre-treatment chemicals into the ALD reactor chamber before the precursor is introduced.

Figure 6A:
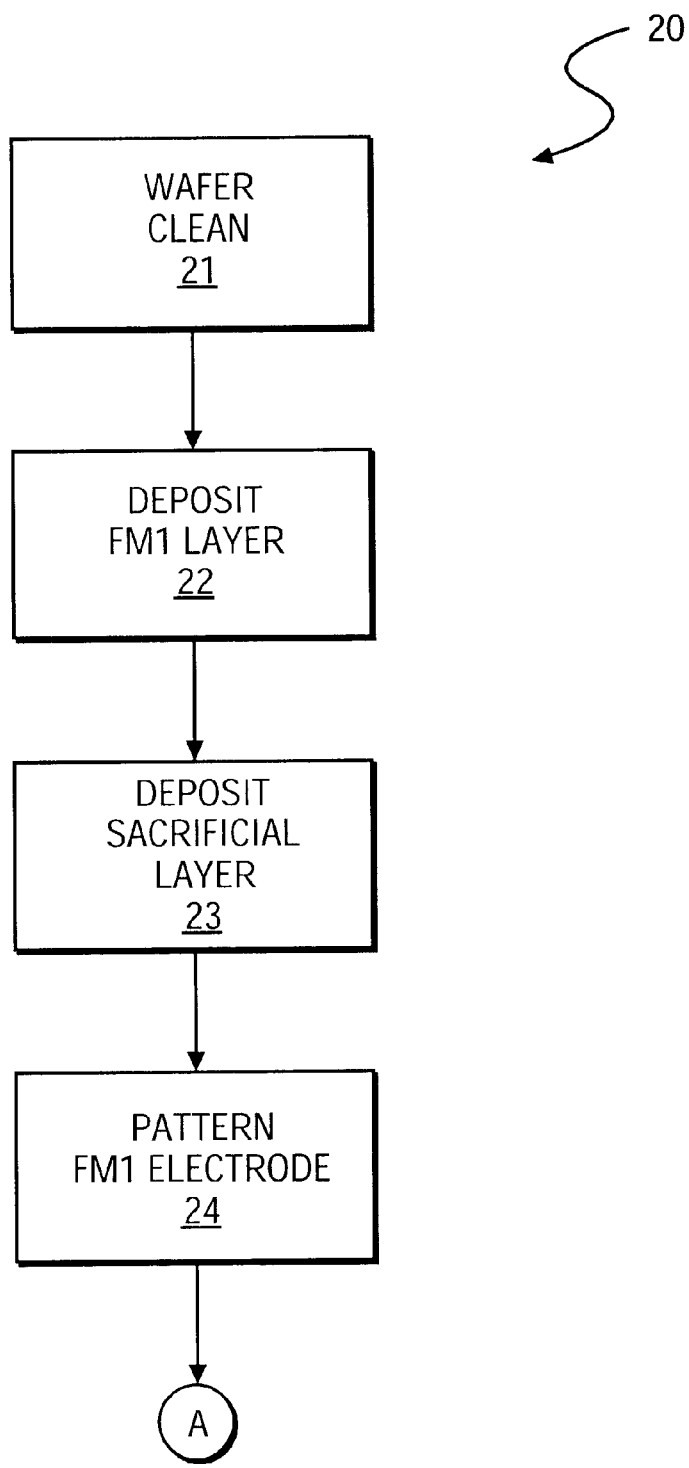
FIGS. 6A–B show a flow diagram for practicing one method of the invention.
Figure 6B:
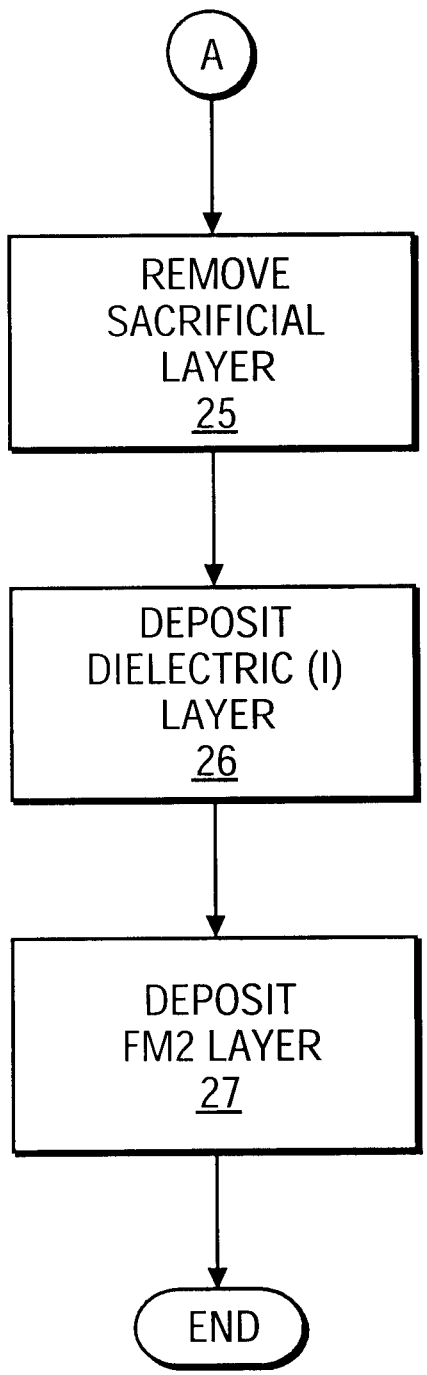

Referring to FIGS. 6A–B, a flow diagram 20 exemplifies one embodiment of the base process for forming a FM/I/FM device on a ceramic wafer. After wafer clean (block 21), a first FM layer is deposited by PVD (block 22) followed by a PVD deposition of a PS layer (block 23), without exposing the first FM layer to ambient or other oxidizing/contaminating environment. The FM1/PS stack is patterned and etched (block 24). Next, the wafer is transported to an ALD reactor without concern for FM1 oxidation, since FM1 layer is not exposed. In the ALD reactor, the PS layer is removed (block 25), followed by dielectric (I) layer deposition by ALD (block 26). Finally, the wafer is placed back in the PVD chamber for the PVD deposition of the second FM layer (block 27). It is to be noted that the wafer may be transferred to a different system between the transition between block 26 and block 27.

Figure 7:
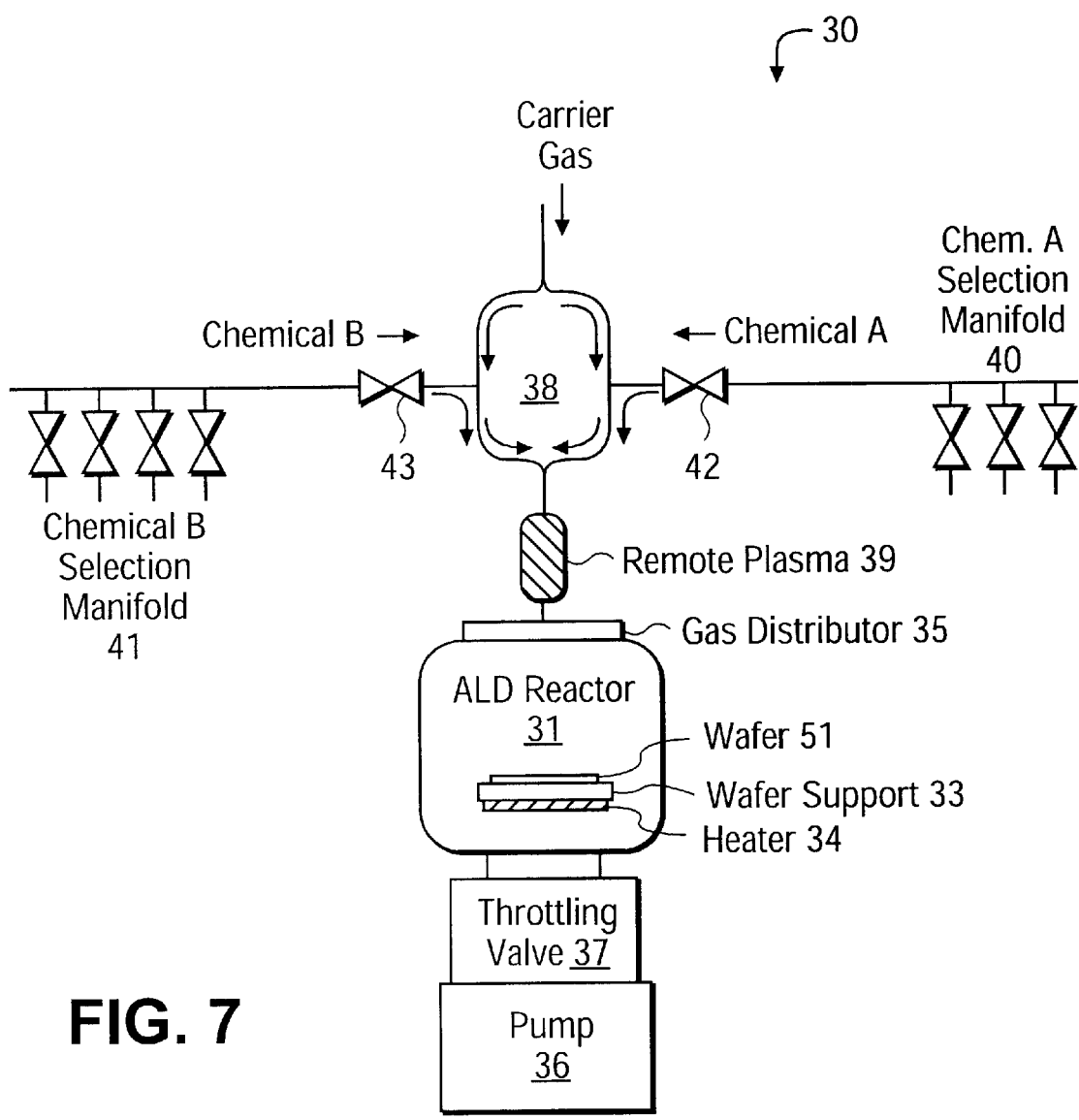
FIG. 7 is a block diagram showing an apparatus for performing ALD to form a FM/I junction of the invention.

An apparatus for performing ALD to practice the invention is shown in FIG. 7. An example ALD reactor apparatus 30 is shown. Reactor 30 includes a processing chamber 31 for housing a wafer 51. Typically the wafer 51 resides atop a support (or chuck 33). A heater 34 is also coupled to the chuck 33 to control temperature of the chuck 33 and the wafer 51 for deposition. Processing chemicals are combined with a carrier gas upstream and introduced into the chamber 31 through a gas distributor 35 located at upstream end of the chamber 31. A vacuum pump 36 and a throttling valve 37 are located at the downstream end to draw and regulate the gas flow across the wafer surface.

A manifold 38 combines the various processing chemicals with the carrier gas and the carrier gas/chemical combination is directed to a remote plasma forming zone 39 for forming plasma when necessary. A variety of techniques for combining gasses and forming plasma may be utilized, including adapting techniques known in the art. The remotely formed plasma 39, need not necessarily be placed in-line as shown in the FIG. 7. The carrier gas is then fed through the gas distributor 35 and then into the chamber 31.

The manifold 38 has two inlets for the introduction of chemicals, as well as for the carrier gas. The carrier gas is typically an inert gas, such as nitrogen. Additional inlets can be readily coupled to the manifold 38. In the example apparatus 30, the manifold is a gas switching manifold to switch in the various chemicals into the flow stream of the carrier gas. Chemical A in the example pertains to the first precursor and chemical B pertains to the second precursor for performing ALD for a two precursor process. Chemical selection manifolds 40 and 41, comprised of a number of regulated valves, provide for the selection of chemicals that may be used as precursors A and B, respectively. Inlet valves 42 and 43 respectively regulate introduction of the precursor chemistries A and B into the manifold 38. The valves 42, 43 are typically pulsed open for a certain duration pulse time to control the timing and amount of chemical insertion into the carrier stream.

The particular manifold 38 has a split flow stream of carrier gas. In the diagram, the right flow stream is used to carry chemical A when chemical A is introduced into the carrier gas flow stream. Likewise the left flow path of carrier gas is used for chemical B when chemical B is introduced into the left flow path. It is appreciated that the split flow design of the carrier gas may have additional flow path. The continuous flow of the carrier gas through the split path ensures that a continuous flow is available whenever chemical A or chemical B is introduced into the manifold. Furthermore, when the chemicals are not introduced into the manifold the continuous flow of the carrier gas ensures that the reactor is purged of previous precursors.

In one particular application of the ALD reactor, the carrier gas continuously flows, while chemical A and chemical B are alternatively pulsed into the manifold to pulse the first and second precursors into the reactor chamber. The continuous flowing of the carrier gas between the pulsed opening of the valves 42 and 43 ensures that the reactor is purged of the previous precursor before the next precursor is introduced to the reactor 31. When pre-treatment is desired to initiate the growth of films on different substrates, pre-treatment chemicals may be introduced into the manifold 38 through either valves 42, 43 or another valve.

It is appreciated that a number of techniques are available to remove the PS layer overlying the FM layer. In one technique, a cluster tool provides a separate chamber for etching the PS layer and a separate layer for ALD of the dielectric layer. Since both chambers are within the non-ambient environment of the tool, the uncovered FM layer is not exposed (at least considerably limited in exposure) to the ambient.

In another technique, the ALD chamber may also provide both processing functions. Prior to ALD, an etchant may be introduced into the reactor, typically through the manifold 38 of the example system of FIG. 7, so that the etchant may remove the PS layer prior to ALD. The carrier gas would purge the etchant before performing ALD. It is appreciated that other designs may be readily implemented to utilize the same reactor chamber for both removing the PS layer and depositing the dielectric layer by ALD.

Thus, an apparatus and method to perform fully integrated ALD to deposit a dielectric layer over a ferromagnetic layer to form a FM/I junction is described. The technique may be used to fabricate a FM/I/FM device on a ceramic substrate. Other materials may be used for the base substrate (or wafer). The present invention provides integration solution throughout the necessary processes of forming the bottom FM layer and forming a subsequent dielectric layer above the FM layer without (or at least minimized) oxidization or contamination of the FM/I interface. Furthermore, it is to be noted that the technique described above may be applied to form devices other than ferromagnetic memory storage devices. Other structures employing a ferromagnetic insulator tunneling junction can be readily manufactured utilizing various embodiments of the invention.

I claim:

1. A method comprising:

depositing a first ferromagnetic layer onto an underlying material;

depositing a protective sacrificial layer above the first ferromagnetic layer without exposing the first ferromagnetic layer to ambient environment, the protective sacrificial layer being removal selective over the first ferromagnetic layer;

exposing the protective sacrificial layer to an oxidizing ambient to undergo photolithographic and material removal processes that form a defined stacked structure by pattern delineating the first ferromagnetic layer;

placing the material into a vacuum environment prior to removing the protective sacrificial layer;

removing the protective sacrificial layer by a selective process to expose the first ferromagnetic layer under vacuum; and depositing a dielectric layer over the first ferromagnetic layer by atomic layer deposition in the vacuum environment.

2. The method of claim 1 further comprising depositing a second ferromagnetic layer above the deposited dielectric layer.

3. The method of claim 1 further comprising depositing a second protective sacrificial layer above the dielectric layer by atomic layer deposition without exposing the dielectric layer to the ambient environment, patterning the dielectric layer in an oxidizing ambient, and placing the material into a non-ambient environment to remove the second protective sacrificial layer and to deposit a second ferromagnetic layer above the dielectric layer.

4. The method of claim 2 further comprising forming ferromagnetic-dielectric-ferromagnetic tunneling junctions on the material by forming the first ferromagnetic, dielectric and second ferromagnetic layers.

5. The method of claim 1 wherein said depositing of the dielectric layer deposits the dielectric layer to a thickness in an approximate range of 5–20 Angstroms.

6. The method of claim 1 wherein said removing the protective sacrificial layer includes removing by isotropic dry etch.

7. The method of claim 1 wherein said removing the protective sacrificial layer includes removing by isotropic dry etch using fluorine chemistry.

8. The method of claim 1 wherein said depositing the dielectric layer includes depositing $Al_2O_3$.

9. The method of claim 1 wherein said depositing the dielectric layer includes depositing AlN.

10. The method of claim 1 further comprising activating a surface of the first ferromagnetic layer to enhance surface activation to perform atomic layer deposition prior to depositing the dielectric layer.

11. A method of fabricating a ferromagnetic-dielectric-ferromagnetic tunneling device comprising:

depositing a first ferromagnetic layer onto a substrate;

depositing a protective sacrificial layer above the first ferromagnetic layer without exposing the first ferromagnetic layer to ambient environment, the protective sacrificial layer being etch selective over the first ferromagnetic layer;

patterning the first ferromagnetic layer and the overlying protective sacrificial layer to form a patterned stack in an oxidizing ambient;

placing the substrate into an atomic layer deposition chamber;

removing the protective sacrificial layer in the atomic layer deposition environment to expose the first ferromagnetic layer;

depositing a dielectric layer over the first ferromagnetic layer by atomic layer deposition; and depositing a second ferromagnetic layer over the dielectric layer.

12. The method of claim 14 wherein said removing the protective sacrificial layer includes removing by isotropic dry etch.

13. The method of claim 14 wherein said removing the protective sacrificial layer includes removing by isotropic dry etch using fluorine chemistry.

14. The method of claim 14 wherein said depositing the protective sacrificial layer includes depositing W or WNx.

15. The method of claim 14 wherein said depositing the protective sacrificial layer includes depositing Si or SiNx.

16. The method of claim 14 wherein said depositing the dielectric layer includes depositing $Al_2O_3$.

17. The method of claim 14 wherein said depositing the dielectric layer includes depositing AlN.

18. The method of claim 14 wherein said depositing of the dielectric layer deposits the dielectric layer to a thickness in an approximate range of 5–20 Angstroms.

19. The method of claim 14 further comprising depositing a second protective sacrificial layer above the dielectric layer by atomic layer deposition without exposing the dielectric layer to the ambient environment, patterning the dielectric layer in an oxidizing environment, and removing the second protective sacrificial layer before deposition of the second ferromagnetic layer without exposing the underlying dielectric layer to the ambient environment to deposit the second ferromagnetic layer.

20. The method of claim 14 further comprising activating a surface of the first ferromagnetic layer to enhance surface activation to perform atomic layer deposition of the dielectric layer.

21. The method of claim 23 wherein said activating further includes activating by exposure to $NH_3/H_2$ plasma to remove surface fluorine and facilitate $NH_x$, species termination.

* * * * *